(12) United States Patent
Park et al.

(10) Patent No.: US 7,466,196 B2
(45) Date of Patent: Dec. 16, 2008

(54) DETECTOR FOR AUTOMATIC GAIN CONTROL

(75) Inventors: Sung Kyung Park, Daejeon (KR); Cheon Soo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 11 days.

(21) Appl. No.: 11/677,103

(22) Filed: Feb. 21, 2007

(65) Prior Publication Data

US 2008/0129378 A1 Jun. 5, 2008

(30) Foreign Application Priority Data

Dec. 5, 2006 (KR) ............... 10-2006-0122393

(51) Int. Cl.
*H03G 3/20* (2006.01)
(52) U.S. Cl. ............... 330/140; 330/254; 330/85
(58) Field of Classification Search ............ 330/140, 330/254, 85
See application file for complete search history.

(56) References Cited

U.S. PATENT DOCUMENTS

| | | | |
|---|---|---|---|
| 4,258,327 A | | 3/1981 | Fujimoto |
| 5,430,765 A | * | 7/1995 | Nagahori .............. 375/318 |
| 6,169,452 B1 | * | 1/2001 | Popescu et al. ........ 330/254 |
| 6,169,619 B1 | * | 1/2001 | Ide ...................... 398/209 |
| 6,304,357 B1 | * | 10/2001 | Ohhata et al. ........... 398/209 |

(Continued)

FOREIGN PATENT DOCUMENTS

JP 06-283940 10/1994

(Continued)

OTHER PUBLICATIONS

Tanabe, Akira, et al., "A Single Chip 2.4Gb/s CMOS Optical Receiver IC with Low Substrate Crosstalk Preamplifier", *ISSCC98 Multi-Gigahertz Serial Data*, Paper SA 19.2.

(Continued)

*Primary Examiner*—Patricia Nguyen
(74) *Attorney, Agent, or Firm*—Ladas & Parry LLP

(57) ABSTRACT

Provided is a detector for automatic gain control (AGC). The detector for AGC is used for a variable gain amplifier (VGA) including at least one VGA cell. The detector for AGC includes: first and second transistors having drains connected in common to a power supply voltage and sources connected in common to a first node, and driven in response to a non-inverting output voltage and an inverting output voltage of the VGA cell, respectively; a first current source connected between the sources of the first and second transistors and a ground voltage to supply a predetermined current; a third transistor having a drain and a source connected to the power supply voltage and a second node, respectively, and driven in response to a pre-set reference voltage; a second current source connected to the source of the third transistor and the ground voltage to supply a predetermined current; and a comparator having a non-inverting input terminal and an inverting input terminal connected to the first and second nodes, respectively, and comparing a peak voltage from the first node with a reference voltage from the second node to output a control voltage with a predetermined level to the VGA cell based on the comparison result. The detector for AGC can continuously and effectively detect an output swing of the VGA.

4 Claims, 3 Drawing Sheets

U.S. PATENT DOCUMENTS

| | | | |
|---|---|---|---|
| 7,123,098 B2 * | 10/2006 | Bae et al. | 330/308 |
| 7,126,419 B2 * | 10/2006 | Miyasita | 330/69 |
| 2004/0166821 A1 | 8/2004 | Varra et al. | |

FOREIGN PATENT DOCUMENTS

| | | |
|---|---|---|
| JP | 9-46140 | 2/1997 |
| JP | 2000-156617 | 6/2000 |
| JP | 2002-043876 | 2/2002 |
| JP | 2004-260488 | 9/2004 |
| KR | 20030082848 | 10/2003 |
| WO | WO03/077416 | 9/2003 |

OTHER PUBLICATIONS

Chow, Hwang-Cherng, et al., "High Performance Automatic Gain Control Circuit Using a S/H Peak-Detector for ASK Receiver", 2002.

* cited by examiner (a)

(b)

DETECTOR FOR AUTOMATIC GAIN CONTROL

CROSS-REFERENCE TO RELATED APPLICATION

This application claims priority to and the benefit of Korean Patent Application No. 2006-0122393, filed Dec. 5, 2006, the disclosure of which is incorporated herein by reference in its entirety.

BACKGROUND

1. Field of the Invention

The present invention relates to a detector for automatic gain control (AGC) and, more specifically, to a circuit configuration of a detector for AGC, which is applied to an analog variable gain amplifier (VGA) for a radio-frequency (RF) receiver or an optical communication interface.

2. Discussion of Related Art

In general, a VGA is required at an RF receiving terminal in order to amplify a weak signal and reduce a too high signal based on a reference level to maximize the dynamic range of an analog-to-digital converter (ADC). A VGA gain is adaptively controlled using an AGC function so that an output signal of the VGA can be kept constant irrespective of an input signal level.

Specifically, by putting a detector in a feedback path, the detector may receive the output signal of the VGA, produce a control signal of the VGA gain in response to the output signal of the VGA, and varies the VGA gain. When the output signal of the VGA is at a higher level than the reference level, the detector produces a signal for lessening the VGA gain. When the output signal of the VGA is at a lower level than the reference level, the detector produces a signal for increasing the VGA gain.

By the above-described feedback function of the detector, the output signal of the VGA is maintained at a desired level in spite of variation in peak of an input signal. For this reason, the detector should accurately detect a peak in an output swing of the VGA.

The foregoing detector for AGC may operate in a digital region or in an analog region. Hereinafter, only a detector for AGC with an analog circuit configuration will be described.

FIG. 1 is a circuit diagram of conventional source-follower detector.

Referring to FIG. 1, the conventional source-follower detector includes a source-follower transistor M1, a bias-current transistor M2, and a capacitor C.

In the conventional source-follower detector, when a peak in an input signal is varied, i.e., increased and then decreased, a reduced peak value cannot be detected without resetting the capacitor C.

Meanwhile, an AGC detector, which receives the output signal of the VGA, should function as a low pass filter (LPF) that continuously detects an output swing of the VGA in all cases and filters an RF noise element.

SUMMARY OF THE INVENTION

The present invention is directed to a detector for automatic gain control (AGC), which is used for an analog variable gain amplifier (VGA) for and RF receiver or an optical communication receiver and includes a swing/peak detection circuit that performs an AGC function to continuously and effectively detect an output swing of the VGA.

One aspect of the present invention provides a detector for AGC that is used for a VGA including at least one VGA cell. The detector for AGC includes: first and second transistors having drains connected in common to a power supply voltage and sources connected in common to a first node, and driven in response to a non-inverting output voltage and an inverting output voltage of the VGA cell, respectively; a first current source connected between the sources of the first and second transistors and a ground voltage to supply a predetermined current; a third transistor having a drain and a source connected to the power supply voltage and a second node, respectively, and driven in response to a pre-set reference voltage; a second current source connected to the source of the third transistor and the ground voltage to supply a predetermined current; and a comparator having a non-inverting input terminal and an inverting input terminal connected to the first and second nodes, respectively, and comparing a peak voltage from the first node with a reference voltage from the second node to output a control voltage with a predetermined level to the VGA cell based on the comparison result.

The reference voltage level may be determined in consideration of an output swing of the VGA and the power supply voltage.

The first and second current sources may be selected to make a voltage at the first node lower than a voltage at the second node when a gain of the VGA is a minimum.

The detector for AGC may further include parasitic capacitors located at the first and second nodes, respectively.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is through and complete and fully conveys the scope of the invention to those skilled in the art.

Figure 2:
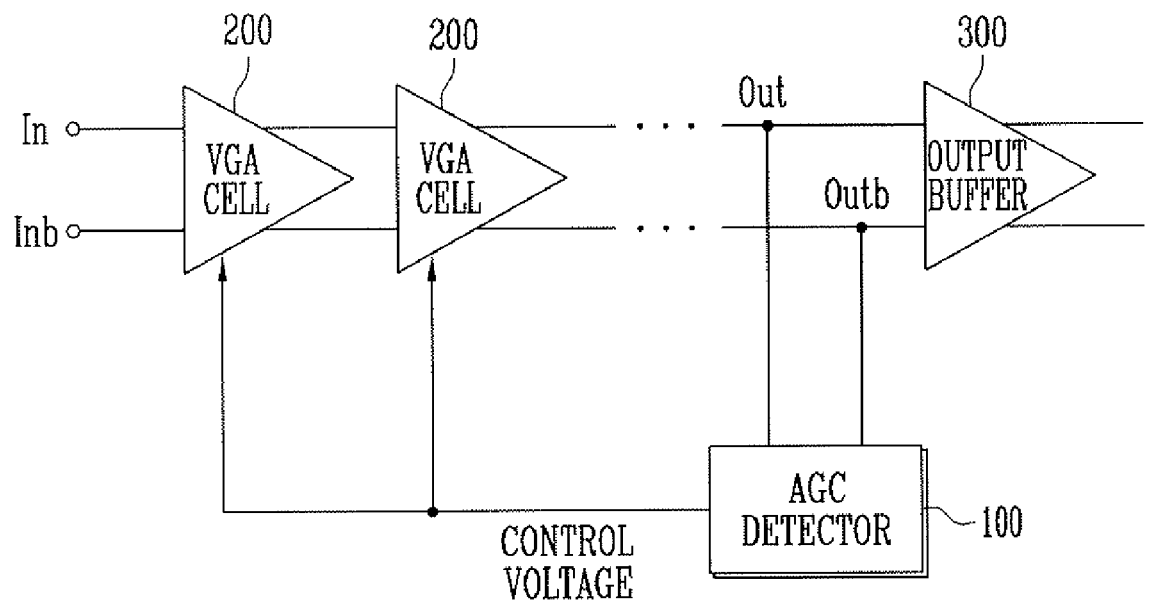
FIG. 2 is a construction diagram of a variable gain amplifier (VGA) including a detector for automatic gain control (AGC) according to an embodiment of the present invention.

FIG. 2 is a construction diagram of a VGA including a detector for AGC according to an embodiment of the present invention.

Referring to FIG. 2, a detector 100 for AGC according to the embodiment of the present invention, which is located in the VGA, receives VGA output signals Out and Outb and outputs a control signal (e.g., a control voltage) to each VGA cell 200 connected in a multi-stage structure.

When a peak in an input signal of the detector 100 is at a higher level than a reference signal Ref of the detector 100, the control signal issues a command to reduce a gain of each VGA cell 200. Also, when an input swing or the detector 100 is at a lower level than the reference signal Ref of the detector 100, the control signal issues a command to increase the amplification degree of each VGA cell 200. Thereafter, the VGA output signals Out and Outb are transmitted through an output buffer 300 to the next stage.

FIGS. 3(a) and (b) are graphs showing gains of each VGA cell and a VGA circuit depending on a control voltage of the VGA. Thus, FIGS. 3(a) and (b) show circuit gains depending on the control voltage when each VGA cell (200 in FIG. 2) is a differential amplifier with a linear degeneration transistor resistor and an AGC detector is the AGC according to the present invention.

Figure 3:
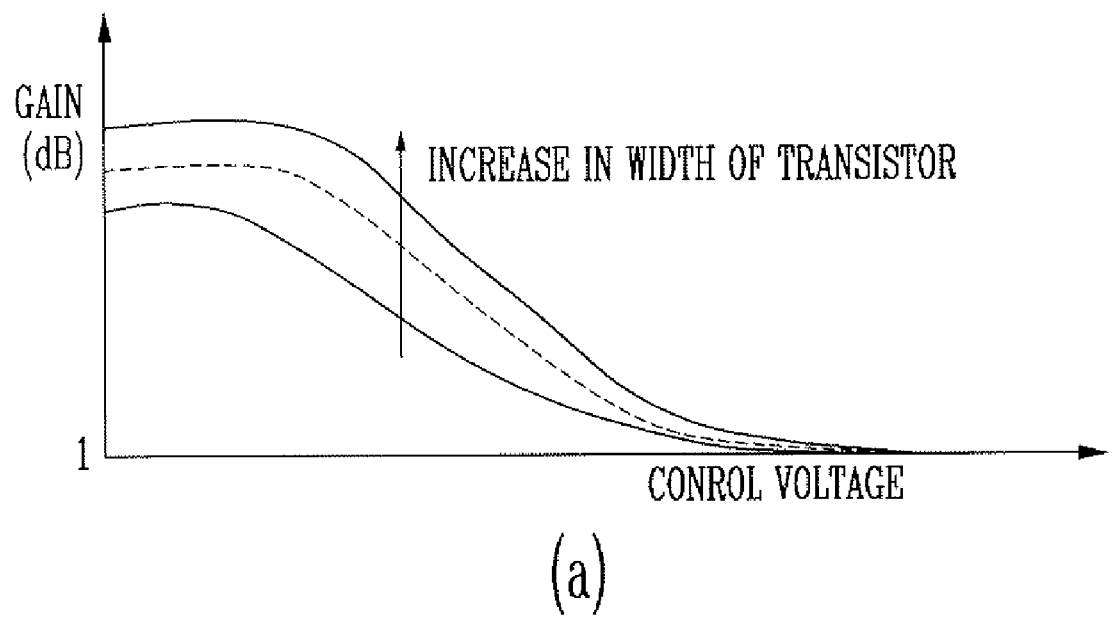
FIGS. 3(a) and (b) are graphs showing gains of each VGA cell and a VGA circuit depending on a control voltage of the VGA.
Figure 3:
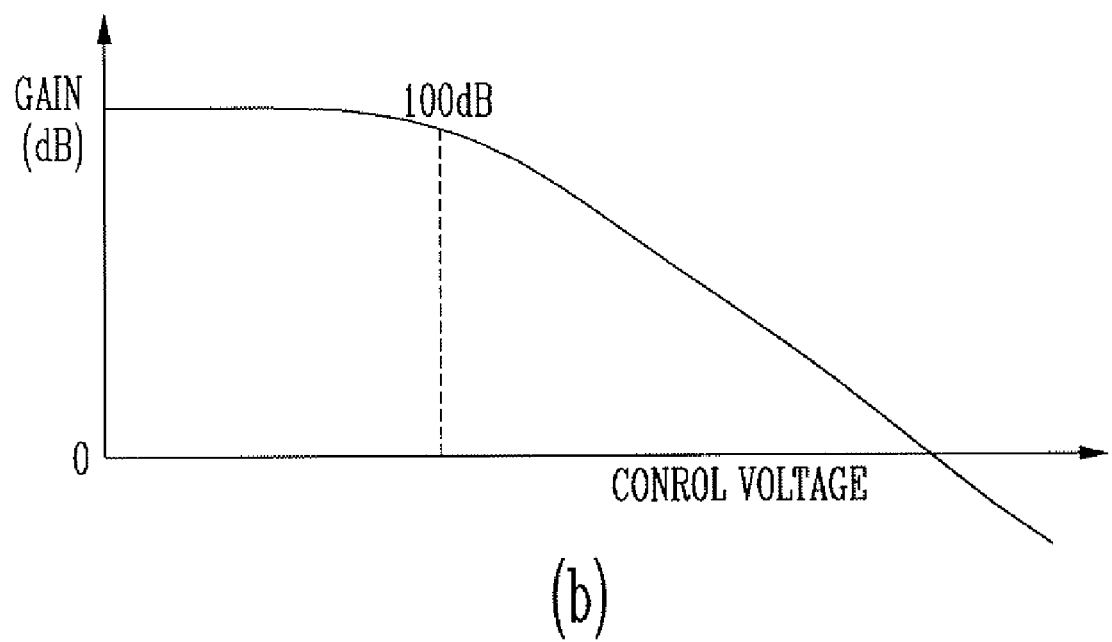

(a) in FIG. 3 shows the gain of each VGA cell 200 depending on the control voltage and the gain of each VGA cell 200 depending on the width of a linear degeneration transistor. Specifically, there is a region where the gain of each VGA call 200 is inversely proportional to the control voltage, and the gain of each VGA cell 200 is generally proportional to the width of the linear degeneration transistor. (b) in FIG. 3 shows the gain of the VGA depending on the control voltage.

In order that the VGA operate in the above-described manner, the AGC detector 100 should continuously detect swings and peaks irrespective of whether the output signal of the VGA makes a high-to-low transition or a low-to-high transition.

Figure 1:
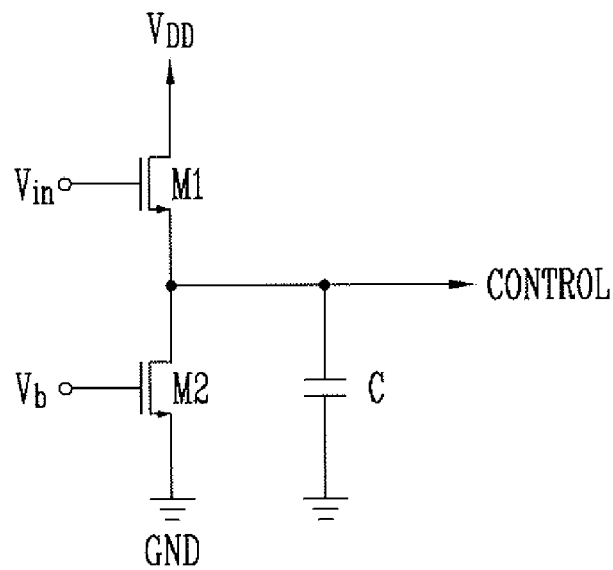
FIG. 1 is a circuit diagram of a conventional source-follower detector.

Therefore, the VGA may include a detector using a reference signal Ref instead of the conventional source-follower peak detector shown in FIG. 1.

Figure 4:
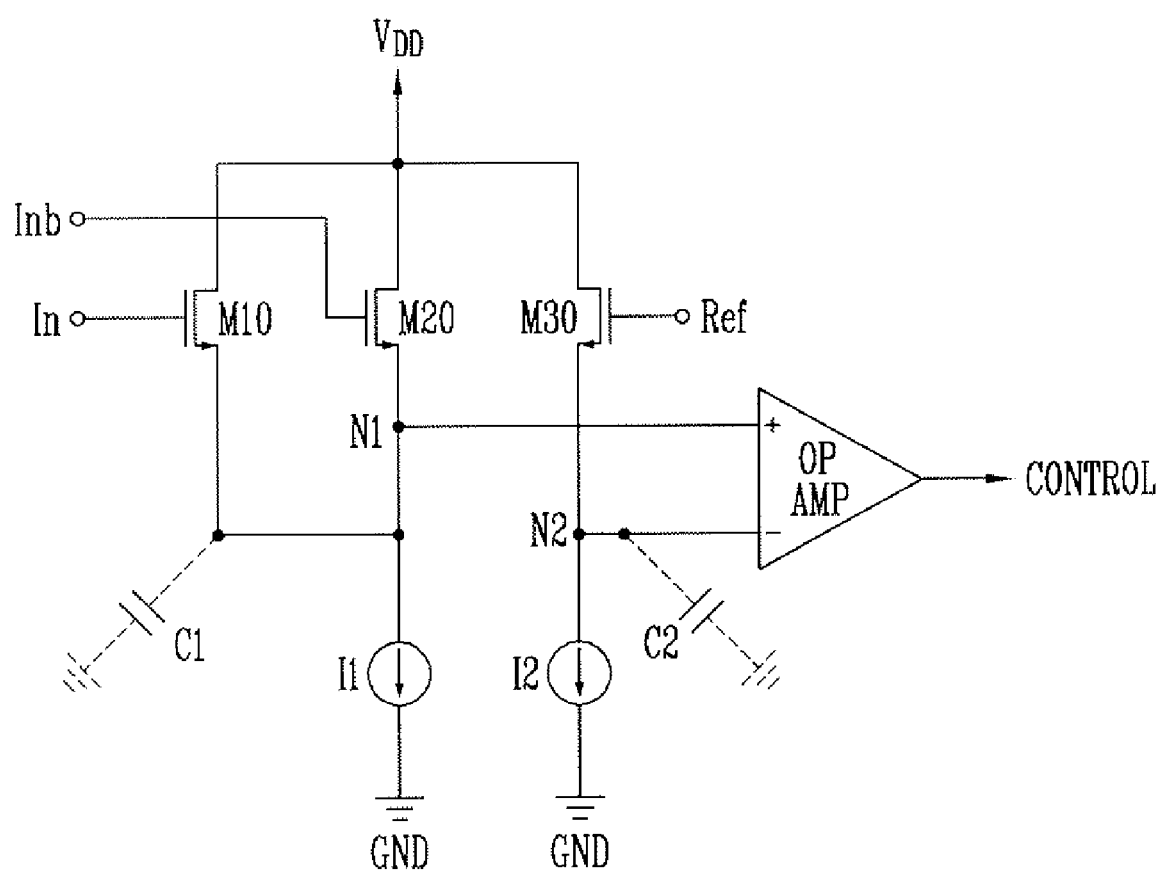
FIG. 4 is a circuit diagram of a detector for AGC according to an embodiment of the present invention.

FIG. 4 is a circuit diagram of a detector for AGC according to an embodiment of the present invention. Here, the detector may be a differential detector (refer to 100 in FIG. 1), which detects an output level based on the reference signal Ref and filters an RF element using an LPF.

Referring to FIG. 4, the detector 100 for AGC according to the embodiment of the present invention includes a transistor M10 for non-inverting input In, a transistor M20 for inverting input Inb, a transistor M30 for a reference level Ref, a current bias I1 for input, a current bias I2 for the reference level Ref, and a comparator OP AMP.

Also, parasitic capacitors C1 and C2 are located at first and second nodes N1 and N2, respectively.

Here, a drain of the transistor Ml0 for non-inverting input In and a drain of the transistor M20 for inverting Inb are connected in common to a power supply voltage VDD, and a source of the transistor M10 for non-inverting input In and a source of the transistor M20 for inverting input Inb are connected in common to the first node N1. Also, the transistor M10 for non-inverting input in is driven in response to a non-inverting input (In) signal, while the transistor M20 for inverting input Inb is driven in response to an inverting input (Inb) signal.

A drain of the transistor M30 for the reference level Ref is connected to the drains of the transistor M10 for non-inverting input In and the transistor M20 for inverting input Inb. Also, the transistor M30 for the reference level Ref is driven in response to a pre-set reference signal.

The current bias I1 for input is connected between the sources of the transistor M10 for non-inverting input In and the transistor M20 for inverting input Inb and a ground voltage GND and supplies a predetermined current.

The current bias I2 for the reference level Ref is connected between the source of the transistor M30 for the reference level Ref and the ground voltage GND and supplies a predetermined current.

Further, a non-inverting input (+) terminal and an inverting input (−) terminal of the comparator OP AMP are connected to the first and second nodes N1 and N2, respectively. The comparator OP AMP compares a peak voltage from the first node N1 with a reference voltage Ref from the second node N2 and outputs a control voltage with a predetermined level to each VGA cell (200 in FIG. 2) based on the comparison result.

Meanwhile, the reference voltage level Ref may be determined in consideration of the output swing of the VGA and a DC common mode voltage (i.e., a power supply voltage VDD).

Also, when the gain of the VGA is the minimum, the current bias I1 for input and the current bias I2 for the reference level Ref are selected to make a voltage at the first node N1 lower than a voltage at the second node N2, so that a feedback function can be always performed.

In addition, the comparator OP AMP functions as an LPF that filers an RF noise.

As described above, a detector for AGC according to the present invention can be applied to a VGA to obtain a desired curve of gain depending on a control voltage. Also, the detector for AGC can continuously detect an output swing of the VGA so that an RF noise can be filtered.

Furthermore, the detector for AGC according to the present invention may be applied to a VGA cell structure using a conventional linear resistor along with an additional circuit for variable region control and have a simple configuration.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A detector for automatic gain control (AGC), which is used for a variable gain amplifier (VGA) including at least one VGA cell, the detector comprising:

first and second transistors having drains connected in common to a power supply voltage and sources connected in common to a first node, and driven in response to a non-inverting output voltage and an inverting output voltage of the VGA cell, respectively;

a first current source connected between the sources of the first and second transistors and a ground voltage to supply a predetermined current;

a third transistor having a drain and a source connected to the power supply voltage and a second node, respectively, and driven in response to a pre-set reference voltage;

a second current source connected to the source of the third transistor and the ground voltage to supply a predetermined current; and a comparator having a non-inverting input terminal and an inverting input terminal connected to the first and second nodes, respectively, and comparing a peak voltage from the first node with a reference voltage from the second node to output a control voltage with a predetermined level to the VGA cell based on the comparison result.

2. The detector according to claim 1, wherein the reference voltage level is determined in consideration of an output swing of the VGA and the power supply voltage.

3. The detector according to claim 1, wherein the first and second current sources are selected to make a voltage at the first node lower than a voltage at the second node when a gain of the VGA is a minimum.

4. The detector according to claim 1, further comprising parasitic capacitors located at the first and second nodes, respectively.

* * * * *